United States Patent [19]
Pace et al.

[11] Patent Number: 5,606,731
[45] Date of Patent: Feb. 25, 1997

[54] ZEROX-IF RECEIVER WITH TRACKING SECOND LOCAL OSCILLATOR AND DEMODULATOR PHASE LOCKED LOOP OSCILLATOR

[75] Inventors: Gary L. Pace; Vance H. Peterson; Edgar H. Callaway, Jr., all of Boca Raton, Fla.

[73] Assignee: Motorola, Inc., Schaumburg, Ill.

[21] Appl. No.: 399,805

[22] Filed: Mar. 7, 1995

[51] Int. Cl.⁶ .................................................. H04B 1/30
[52] U.S. Cl. ........................ 455/260; 455/75; 455/164.1; 455/192.2; 455/196.1; 455/209; 455/324; 329/325; 375/327
[58] Field of Search ...................................... 455/207, 208, 455/209, 255, 257, 258, 259, 260, 264, 265, 314, 315, 316, 75, 164.1, 164.2, 182.2, 192.2, 196.1, 197.2, 324; 375/327, 344, 376; 329/325, 326

[56] References Cited

U.S. PATENT DOCUMENTS

| | | | |
|---|---|---|---|
| 3,860,874 | 1/1975 | Malone et al. ........................ | 375/327 |
| 4,061,980 | 12/1977 | Sato ........................................ | 455/316 |
| 4,817,167 | 3/1989 | Gassmann .................................. | 381/3 |
| 4,855,835 | 8/1989 | Tohita ................... | 358/195.1 |
| 4,885,802 | 12/1989 | Ragan ..................................... | 455/344 |
| 4,940,950 | 7/1990 | Helfrick ..................................... | 331/2 |
| 4,944,025 | 7/1990 | Gehring et al. .......................... | 455/207 |
| 5,038,404 | 8/1991 | Marz ........................................ | 455/118 |
| 5,481,227 | 1/1996 | Kamori et al. .............................. | 331/2 |
| 5,483,691 | 1/1996 | Heck et al. ........................... | 455/234.2 |
| 5,493,714 | 2/1996 | Cahill ..................................... | 455/259 |

Primary Examiner—Andrew Faile
Assistant Examiner—Lee Nguyen
Attorney, Agent, or Firm—D. Andrew Floam

[57] ABSTRACT

A zero-intermediate frequency receiver circuit (11) for receiving a radio frequency signal detected by an antenna (14). The receiver circuit (10) comprises a second local oscillator circuit (25) and an oscillator circuit (60) of a phase locked loop demodulator (36) which are identical and track each other so as to provide a more accurate reference for processing a demodulated signal. A current reference (39) providing a current reference signal utilized by the second local oscillator circuit (25) and the oscillator circuit (60) of the phase locked loop demodulator (36).

20 Claims, 8 Drawing Sheets

ZEROX-IF RECEIVER WITH TRACKING SECOND LOCAL OSCILLATOR AND DEMODULATOR PHASE LOCKED LOOP OSCILLATOR

RELATED APPLICATIONS

The present application is related to the following commonly assigned applications, filed on even date:

Method and Apparatus for an Automatic Frequency Control Receiver, to Callaway et al, Ser. No. 08/399,785.

Phase Locked Loop Circuit with Current Mode Feedback, to Pace et al., Ser. No. 08/399,784.

FIELD OF THE INVENTION

This invention relates in general to the field of portable communication receivers, and more particularly to an improved Barber type zero-intermediate frequency (zero-IF) receiver circuit.

BACKGROUND OF THE INVENTION

In a Barber type zero-IF receiver circuit, the base band signal is mixed up to an intermediate frequency and a conventional demodulator is used to recover the frequency modulated signal. The output of the demodulator, which can be separated into the desired recovered analog signal and a direct current (DC) offset voltage, is used to drive a data limiter, and in some cases, provide an automatic frequency control (AFC) error signal for the receiver circuit.

The DC offset voltage is a function of the radio frequency (RF) carrier center frequency, first local oscillator frequency and demodulator component values. The manufacturing tolerance and temperature coefficient of the first local oscillator and demodulator components can cause variations in the DC offset voltage such that a fixed data limiter threshold voltage or AFC reference voltage cannot be used. For proper data limiter operation, it is necessary that the data limiter threshold or reference voltage be derived from the demodulator recovered audio output signal so that the effects of variations in the DC offset voltage with the manufacturing tolerance and temperature can be removed.

One problem with deriving the data limiter threshold voltage is that there is a time delay (caused by a time constant in the circuit to remove the effects of modulation of the RF carrier signal) before the threshold voltage is valid. In receivers which are strobed ON and OFF to improve battery life, the time delay in generating a valid data limiter output can require that the receiver be turned ON earlier than necessary, thus degrading battery life. A further description of the problems associated with deriving the data limiter threshold voltage and one method for accomplishing this derivation is disclosed in U.S. Pat. No. 4,929,851. Using one of the known methods for deriving the data limiter threshold voltage provides acceptable data limiter performance(although with a time delay), but the derived threshold voltage is not optimum for use as an AFC reference voltage. This is because the derived data limiter threshold voltage does not accurately represent the deviation of the actual IF center frequency from the desired on-channel IF center frequency.

Accordingly, it is desirable to provide a zero-IF receiver circuit which improves battery life by eliminating the time delay associated with the derivation of the data limiter threshold voltage from the demodulator output signal. In addition, it is desirable to provide an accurate AFC error signal that can be used to control a local oscillator in the circuit, and thus allow the use of a less expensive oscillator crystal. In applications where an accurate AFC error signal is not available, a high stability local oscillator with an expensive crystal is often required.

DETAILED DESCRIPTION OF THE DRAWINGS

Figure 1:
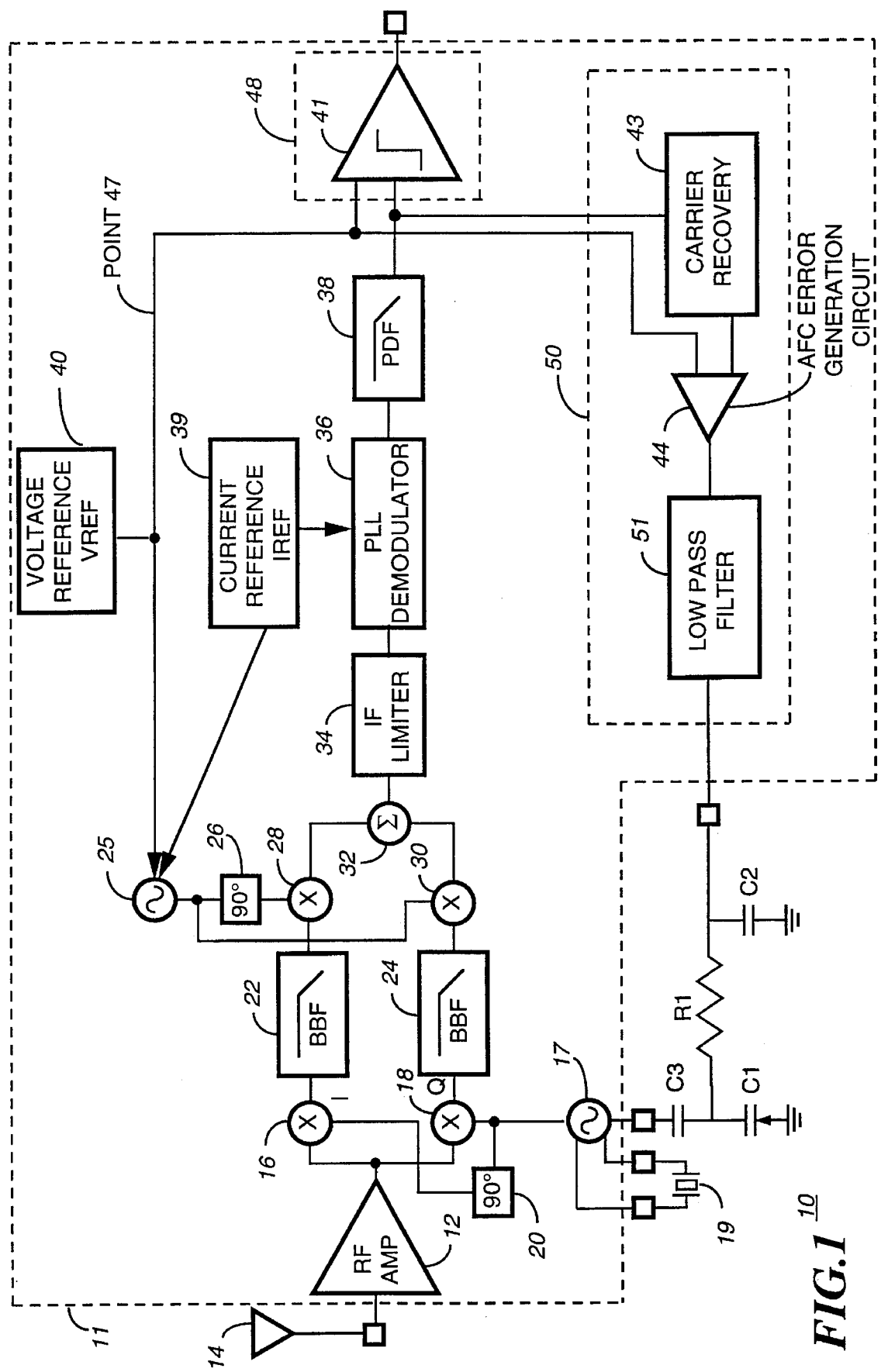
FIG. 1 is an electrical block diagram of a zero-intermediate frequency (zero-IF) receiver circuit according to the present invention.

Referring first to FIG. 1, a zero-IF receiver circuit with automatic frequency control (AFC) is shown generally at 10. The zero-IF receiver circuit 11 (which is all of circuit 10 excluding the AFC feedback, antenna 14 and crystal 19) is a Barber type receiver and is referred to hereinafter as ZIF (standing for "zero-IF") receiver circuit 11, for simplicity. The ZIF receiver circuit 11 is preferably fabricated as a single integrated circuit (IC), and certain advantages flow from a single IC fabrication, as will become apparent hereinafter.

The ZIF receiver circuit 11 comprises a radio frequency (RF) amplifier 12 for amplifying a signal detected by an antenna 14. A first local oscillator 17 is provided to generate a first local oscillator signal for a first of a two channel mixing stage which comprises a pair of mixers 16 and 18, and a 90° phase shifter 20. The frequency of first local oscillator 17 is controlled by crystal 19 and varactor capacitor C1. The amplified RF signal at the output of the RF amplifier 12 is mixed in mixers 18 and 16 with the first local oscillator signal and a 90° phase shifted version of the first local oscillator signal, respectively.

Specifically, mixer 16 mixes the amplified RF signal with the 90° phase shifted version of the first local oscillator signal, to ultimately recover an in-phase (I) component of the received signal. Mixer 18 mixes the amplified RF signal with the first local oscillator signal to ultimately recover a quadrature (Q) component of the received signal. The frequency of the first local oscillator signal is, for example, 150 MHz, in the case of a VHF selective call receiver. The outputs of the mixers 16 and 18 are coupled to base band filters (BBF's) 22 and 24, respectively.

A second mixing stage is provided which includes a second local oscillator 25, a 90° phase shifter 26 and mixers 28 and 30, for the I and Q components, respectively. The outputs of the BBF's 22 and 24 are connected to the inputs of the mixers 28 and 30, respectively. In the second mixing stage, the I and Q base band components are mixed up in frequency by mixers 28 and 30, and added by summer 32 to generate an intermediate frequency signal for amplification and demodulation. In a selective call receiver, the frequency of the second local oscillator circuit 25 is, for example, 50 kHz.

An IF limiter 34 is connected to the output of the summer 32 to amplify the intermediate frequency signal and generate a limited output signal.

A phase lock loop demodulator 36 is connected to the output of the IF limiter 34 and demodulates the output signal of the IF limiter 34 to recover the frequency modulated signal, which is ultimately filtered by the post detection filter (PDF) 38. The output of the phase locked loop demodulator 36 is the unfiltered recovered audio signal (also called the demodulated signal). The output of the PDF 38 is the filtered recovered audio signal, shown at 45 (Vin), and is coupled to data signal processor 48 and to automatic frequency control(AFC) signal processor 50.

The voltage reference (VREF) 40 provides a voltage reference signal for the second local oscillator 25, the phase locked loop demodulator 36, the data signal processor 48 and the automatic frequency control (AFC) signal processor 50.

A current reference circuit 39 provides a current reference signal to the second local oscillator 25 and the phase locked loop demodulator 36.

The data signal processor 48 has a threshold input which is coupled to VREF 40 and a signal input which is coupled to the output of the PDF 38.

There are a number of ways to implement data signal processor 48. In FIG. 1, data signal processor 48 is shown implemented as data limiter 41 to provide a limited output data signal representative of the demodulator recovered audio signal 45 (Vin). The data limiter 41 compares the recovered audio signal 45 (Vin) at its signal input with reference voltage (VREF) 40 at its threshold input and generates a limited data signal at its output.

Automatic frequency control (AFC) signal processor 50 is shown implemented in FIG. 1 using carrier recovery circuit 43, AFC error generation circuit 44 and low pass filter 51. The AFC signal processor 50 likewise has a threshold input coupled to the VREF 40 and a signal input coupled to the output of the PDF 38, Vin. There are other ways of implementing the AFC signal processor 50. The carrier recovery circuit 43 in AFC signal processor 50 derives the direct current (DC) voltage that corresponds to the IF carrier center frequency. In some applications, this derivation can be achieved by using a simple RC low pass filter. In other applications, the use of peak and valley detectors and a resistive network as described in U.S. Pat. No. 4,631,737 can be used to derive the direct current (DC) voltage. The output of the carrier recovery circuit 43 is coupled to AFC error generation circuit 44. AFC error generation circuit 44 compares the output of the carrier recovery circuit 43 with voltage reference (VREF) 40 and generates an AFC error signal which is applied to low pass filter 51. In one implementation, AFC error generation circuit 44 is, for example, a differential amplifier, and low pass filter 51 is a RC network. Capacitor C2 is useful as a one element of low pass filter 51.

To complete the AFC loop, a varactor-tuned or voltage variable capacitor (VVC) C1 is (direct current) DC coupled, via resistor R1, to the output of the AFC signal processor 50. The capacitor C1 is alternating current (AC) coupled via capacitor C3 to the first local oscillator 17 which utilizes crystal 19 to set the oscillator frequency to approximately the correct value. The filtered AFC error voltage from the output of AFC signal processor 50 is applied to the varactor C1 to control the frequency of the first local oscillator 17.

An important and distinctive aspect of the ZIF receiver circuit 11 is that the second local oscillator 25 and the oscillator (not shown in FIG. 1) in the phase locked loop demodulator 36 are identical and track each other, and are controlled by the same current reference circuit 39. This configuration allows voltage reference (VREF) 40 to be used as a channel center frequency reference, limited only by tracking accuracy. Therefore, the voltage reference (VREF) 40 can be used as the threshold voltage for the data signal processor 48 and the reference voltage for AFC signal processor 50. Since the voltage reference (VREF) 40 is not a function of the radio frequency (RF) carrier signal nor of its modulation, this reference voltage can be generated very quickly, resulting in minimum delay in a valid data signal appearing at the output of data signal processor 48. The ZIF receiver circuit 11 thus provides improved battery life over prior art circuits in which the data limiter threshold voltage is derived from the recovered audio output signal each time the receiver is strobed ON. The availability of an accurate AFC reference voltage in ZIF receiver circuit 11 eliminates the need for a high stability local oscillator and expensive crystal in many applications.

Figure 2:
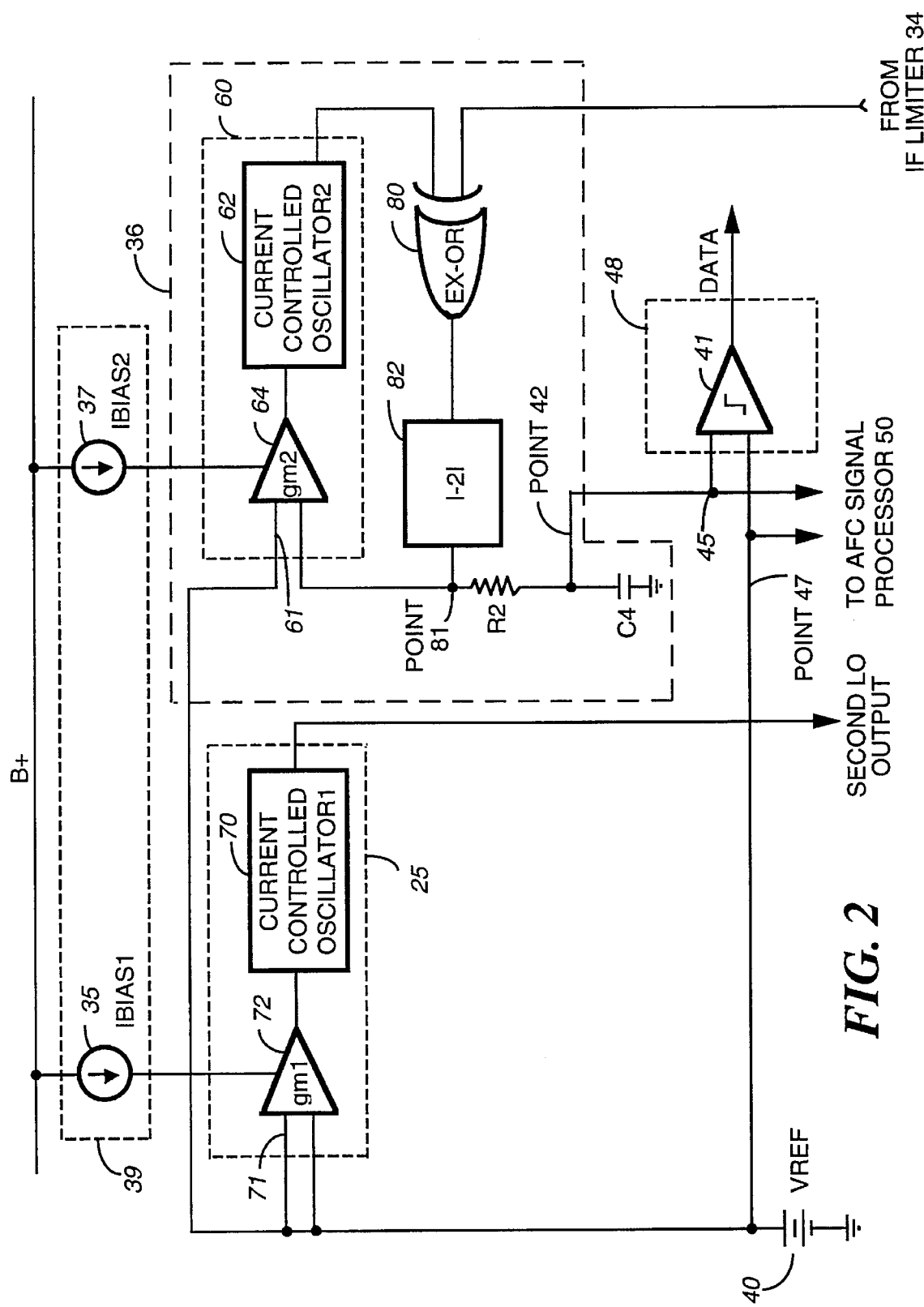
FIG. 2 is an electrical schematic diagram showing a tracking second local oscillator and phase locked loop oscillator in the demodulator according to a first embodiment of the present invention.

Turning now to FIG. 2, there is shown in greater detail the second local oscillator circuit 25 and an oscillator circuit 60 of the phase locked loop demodulator 36 and the coupling therebetween according to a first embodiment of the present invention. The phase locked loop demodulator 36 comprises oscillator circuit 60 which generates as an output a phase locked loop oscillator signal, and a feedback circuit which completes a phase locked loop, as will be described hereinafter.

The voltage reference (VREF) 40 is connected to the second local oscillator circuit 25, to the phase locked loop demodulator 36 and serves as the reference for the data limiter 41 in signal processor 48, and thus eliminates the need to derive the data limiter threshold voltage. Voltage reference (VREF) 40 also serves as a reference voltage for an AFC signal processor, if needed. The connection of the voltage reference (VREF) 40 to input 71 of transconductance amplifier 72 in second local oscillator 25 and to input 61 of transconductance amplifier 64 in the phase locked loop demodulator 36 is optional. The second local oscillator circuit 25 comprises a current controlled oscillator 70 and a transconductance amplifier 72. The oscillator circuit 60 of the phase locked loop demodulator 36 comprises a current controlled oscillator 62 and a transconductance amplifier 64. The output current of transconductance amplifier 64 drives the current controlled oscillator 62.

The inputs 61 and 71 of transconductance amplifiers 64 and 72 are optionally connected together and coupled to a different bias voltage than voltage reference (VREF) 40 without degrading the performance of the circuit. Alternatively, the inputs 61 and 71 of transconductance amplifiers 64 and 72 are eliminated by using single input transconductance amplifiers to replace differential input transconductance amplifiers 64 and 72.

The second local oscillator circuit 25 and the oscillator circuit 60 of the phase locked loop demodulator 36 are identical and are best implemented using the matched characteristics available on an integrated circuit.

The second local oscillator circuit 25 and the oscillator circuit 60 are biased by current sources 35 (IBIAS1) and 37 (IBIAS2), respectively. Current sources 35 and 37 are identical (in magnitude) and represent two outputs of current reference (IREF) 39.

The functional relationship between the inputs and output (also called the "input to output functional relationship") of the second local oscillator circuit 25 and that of the oscillator circuit 60 can be described by algebraic expressions which must be substantially equal to achieve the necessary matching between the two oscillator circuits. There are a number of ways to implement the two oscillator circuits and produce the desired matching. One example of an oscillator circuit is described by the input/output expression:

$$f=fo+(Ko)(gm)(v1-v2) \qquad \text{Expression(1)}$$

where f—oscillator circuit output frequency (of second local oscillator circuit 25 or phase locked loop oscillator circuit 60);

v1 and v2 are differential input voltages to the transconductance amplifier in the oscillator circuit;

fo=oscillator circuit output frequency when v1=v2;

gm=gain of the transconductance amplifier in the oscillator circuit; and

Ko=gain factor for the current controlled oscillator in the oscillator circuit.

The parameters fo, gm and Ko in expression (1) are functions of temperature, manufacturing variations and circuit biasing sources such as current sources 35 or 37. To reiterate, two oscillator circuits are suitable for implementation as second local oscillator 25 and oscillator circuit 60 in phase locked loop demodulator 36 provided that their input/output expressions are substantially the same over the operating range of the ZIF receiver circuit 11. The operating range is defined as the ranges of voltage, current, temperature and frequency, in which the receiver circuit is designed to operate.

As mentioned, the oscillator circuit 60 is identical to the second local oscillator circuit 25 and generates a voltage controlled oscillator signal required for operation of the phase locked loop demodulator 36. The feedback circuit of the phase locked loop demodulator 36 comprises a two-input exclusive-OR gate 80, an I-2I voltage-to-current converter 82 and a loop filter comprising resistor R2 and capacitor C4 connected in series.

The bias current sources 35 and 37 and the voltage reference (VREF) 40 are chosen to force the second local oscillator frequency in the vicinity of the desired second IF frequency. As is known in a Barber receiver, the second IF frequency is equal to the second local oscillator frequency. Because of tracking and the connections between the second local oscillator circuit 25 and the oscillator circuit 60 of the phase locked loop demodulator 36, the average voltage at Point 42 is equal to the voltage reference (VREF) 40 when the second IF frequency is assumed unmodulated. Since voltage reference (VREF) 40 is the threshold voltage for data limiter 41 in data signal processor 48, valid data limiter output occurs without delay as the phase locked loop output voltage at Point 42 tracks the modulated second IF frequency. The actual frequency of the second local oscillator is not important for proper operation as long as the second IF frequency remains within the pass band of the IF limiter 34 (FIG. 1).

A DC-coupled post detection filter, such as the PDF filter 38 shown in FIG. 1 is optionally inserted at Point 42. This added filter may introduce a significant DC offset in the signal path, therefore, a "dummy" filter with the same DC offset is inserted at Point 47. The recovered audio signal 45, when compared with voltage reference (VREF) 40, provides a very accurate measure of RF carrier frequency deviation from the first reference oscillator frequency of the first local oscillator circuit 17, and thus is suitable for use in generating an error signal to control the first oscillator circuit 17 in an AFC receiver, such as that shown in FIG. 1.

Figure 3:
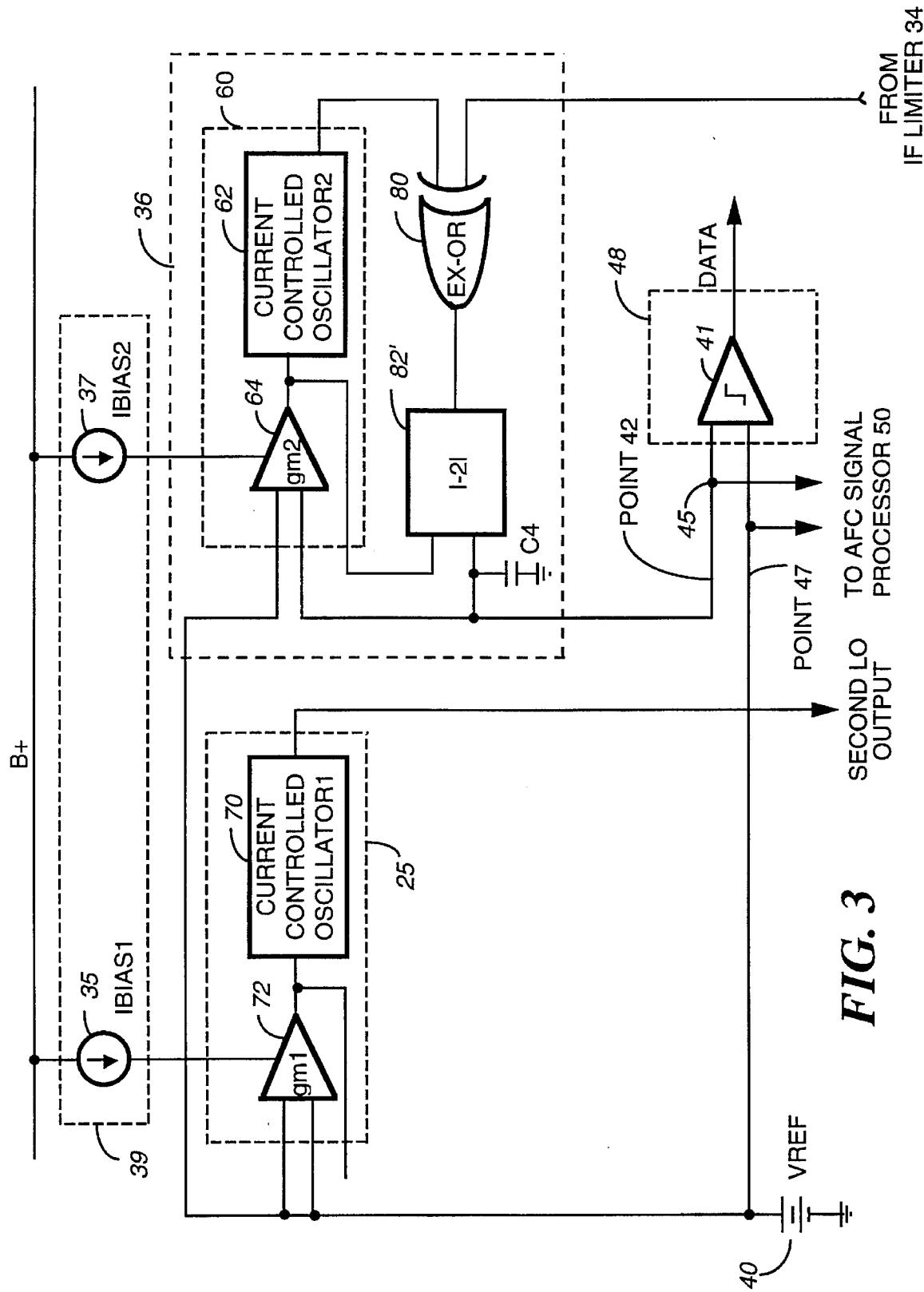
FIG. 3 is an electrical schematic diagram showing a tracking second local oscillator and phase locked loop oscillator in the demodulator according to a second embodiment of the present invention.

FIG. 3 illustrates a circuit which is made more suitable for low power integrated circuit operation by replacing R2 and the single output I-2I voltage-to-current converter 82 in the phase locked loop demodulator 36 in FIG. 2 with a two-output I-2I voltage-to-current converter 82' wherein a current mode path is provided between one output of the I-2I voltage-to-current converter 82' and the input to the current controlled oscillator 62. The two output currents from I-2I voltage-to-current converter 82' are proportional to each other by constant factor. This new circuit configuration of FIG. 3 eliminates a large square wave voltage signal that rides on the recovered audio waveform at Point 81 of the phase locked loop circuit shown in FIG. 2 from the input to the transconductance amplifier 64. The removal of the square wave signal at the input transconductance amplifier 64 reduces the required input dynamic range of this amplifier and thus improves tracking between oscillator circuits 25 and 60. The operation of the modified phase locked loop demodulator 36 shown in FIG. 3 is disclosed in the aforementioned patent application entitled Phase Locked Loop Circuit with Current Mode Feedback, the entire text and drawings of which are herein incorporated by reference.

In the circuit according to the present invention, the information contained in the square wave voltage at Point 81 in FIG. 2 is carried in the added current path in FIG. 3. When the input impedance to the current controlled oscillator 62 is kept low, the voltage on the current path node is also low. For example, in a known application of the phase locked loop demodulator shown in FIG. 2, the amplitude of a square wave voltage on a 35 kHz signal is 300 mV in the phase locked loop demodulator circuit of FIG. 2. By eliminating a similar large square wave voltage in the circuit of FIG. 3, the minimum power supply voltage is reduced by approximately the same amount, or the recovered audio amplitude can be increased correspondingly. This assumes that the signal voltage amplitude on the node at the input to the transconductance amplifier 64 limits the minimum operating voltage of the circuit.

The use of the phase locked loop demodulator 36 with current mode feedback of FIG. 3 causes the connections to the two oscillators circuits 25 and 60 to no longer be identical due to the current input into the current controlled oscillator 62 from the I-2I voltage-to-current converter 82' that is not present at the input to the current controlled oscillator 70 of the second local oscillator circuit 25. To ensure proper oscillator tracking under these circumstances, the average current into the current controlled oscillator 62 from I-2I voltage-to-current converter 82' must be substantially zero. One way to accomplish this is to design all loads in parallel with capacitor C4 to have a relatively high impedance, such as that provided by the use of metal-oxide-silicon (MOS) transistors. If there is no significant load in parallel with capacitor C4, the average current out of I-2I voltage-to-current converter 82' into capacitor C2 is substantially zero. Since the two output currents from I-2I voltage-to-current converter 82' track each other by a constant factor, the output current from converter 82' into current controlled oscillator 62 of oscillator circuit 60 is also substantially zero. Thus, tracking of oscillator circuit 60 and second local oscillator 25 is maintained even with the added current mode input signal to oscillator circuit 60.

The functional relationship between the inputs and output of the second local oscillator circuit 25 and the oscillator circuit 60 in FIG. 3 is different from expression (1) given for the example in reference to FIG. 2 due to the added current mode input signal to oscillator circuit 60. A revised input/output expression for one oscillator circuit that incorporates the added input current follows:

$$f=fo+(Ko)(gm)(v1-v2)+(Ko)(i) \quad \text{Expression (2)}$$

where i=input current to the oscillator circuit.

Figure 4:
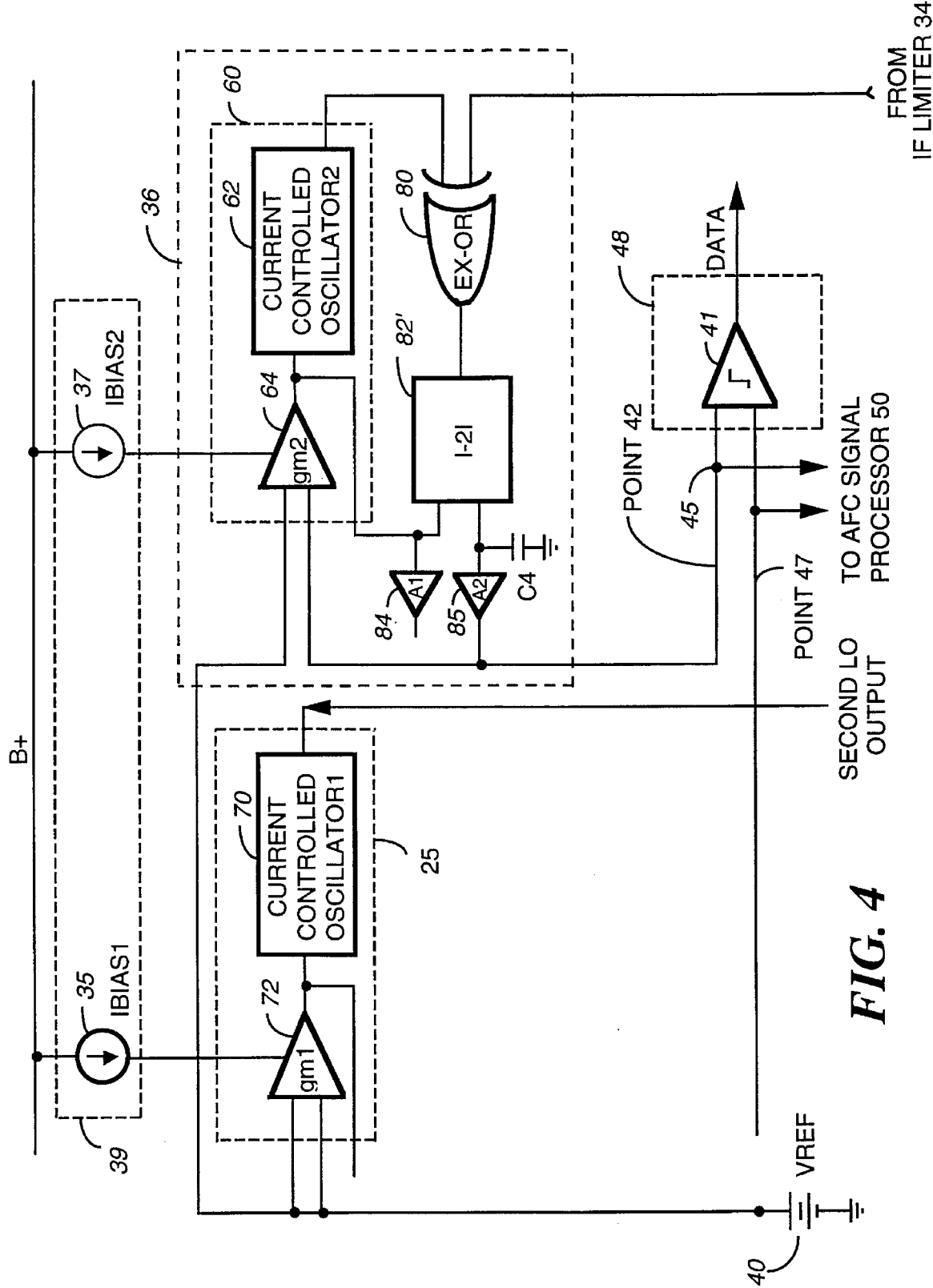
FIG. 4 is an electrical schematic diagram showing a tracking second local oscillator and phase locked loop oscillator in the demodulator according to a third embodiment of the present invention.

Another approach is illustrated in FIG. 4. In this circuit, two buffer amplifiers 84 (A1) and 85 (A2) are connected to the outputs of the I-2I voltage-to-current converter 82'. The buffer amplifiers 84 and 85 have unity gain but other gains are possible. The buffer amplifiers 84 and 85 are matched such that the ratio of their input bias currents is equal to the ratio of the two output currents from the I-2I voltage-to-current converter 82'. This is most readily implemented if the phase locked loop is designed such that the ratio of the I-2I voltage-to-current converter 82' two output currents is one.

Buffer amplifier 84 serves no purpose except to provide a DC load on the second output node of the I-2I voltage-to-current converter 82' that is proportional to that provided by buffer amplifier 85 on the first output node. By using buffer amplifier 85 to isolate all loads in parallel with capacitor C4 and matching buffer amplifier 84 to provide a proportional load on the other node of the I-2I voltage-to-current converter 82', the average current into the current controlled oscillator 62 from converter 82' is forced to be substantially zero.

Figure 5:
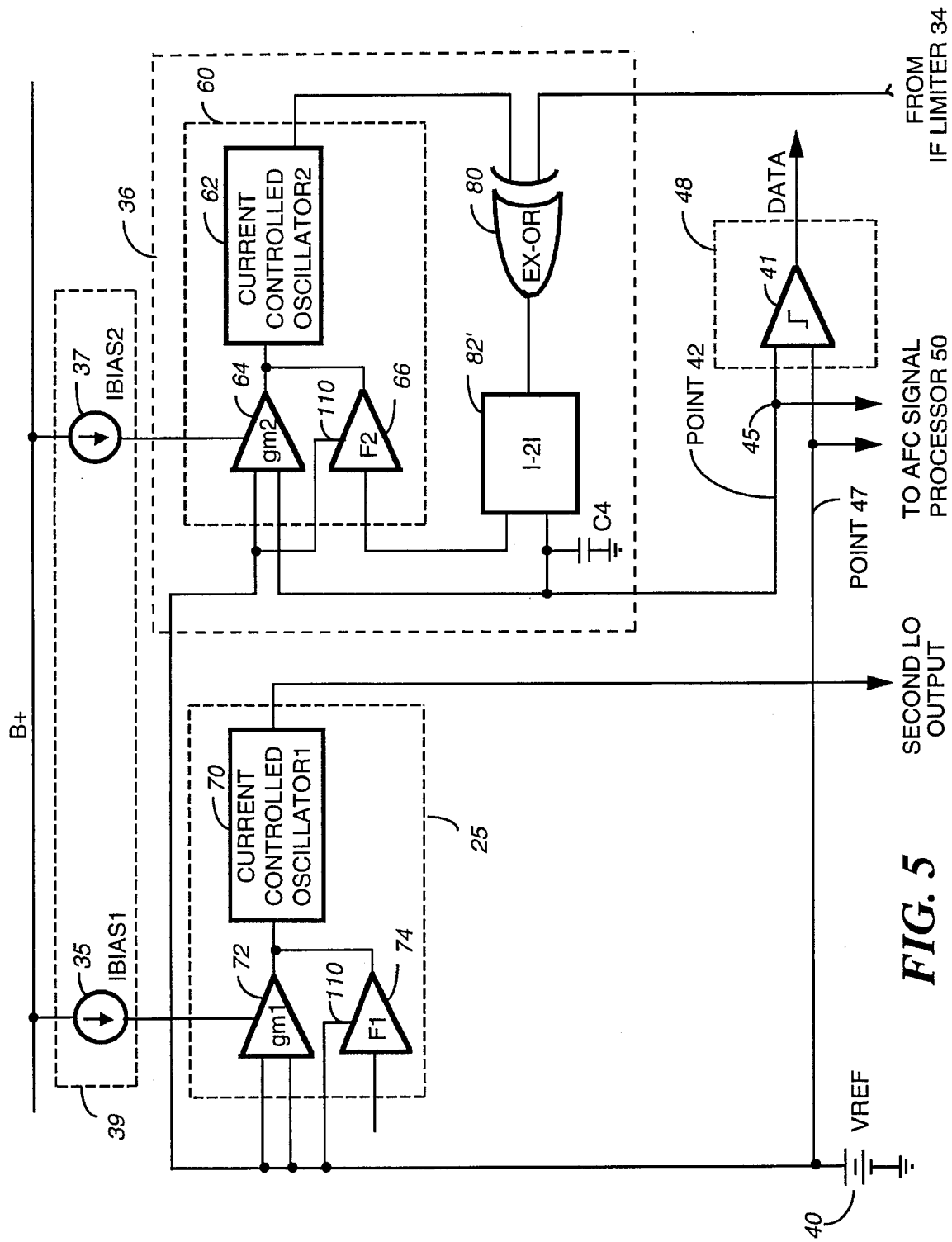
FIG. 5 is an electrical schematic diagram showing a tracking second local oscillator and phase locked loop oscillator in the demodulator according to a fourth embodiment of the present invention.

FIG. 5 illustrates a circuit configuration in which two current amplifiers, 74 (F1) and 66 (F2), are added, each of which has a relatively low impedance input node with input node voltage controlled to be substantially equal to the quiescent voltage on capacitor C4 by the application of reference voltage (VREF) 40 to bias terminal 110 of each amplifier. The addition of current amplifiers 74 and 66 improves the tracking of second local oscillator circuit 25 and oscillator circuit 60 by reducing the sensitivity of the ratio of the two output current from the I-2I voltage-to-current converter 82' to the finite output impedance and limited output dynamic range of the converter 82'. The improvement is achieved because current amplifier 66 isolates the input impedance and input node voltage level of current controlled oscillator 62 from the second output node of converter 82'. The converter 82' is thus driving two nodes which are held at approximately the same quiescent voltage (substantially equal to reference voltage (VREF) 40 causing the ratio of the two output currents from converter 82' to have improved accuracy with a resultant improvement in tracking of second local oscillator 25 and oscillator circuit 60.

The example input/output expression (2) given in reference to FIG. 3 requires modification as follows to accommodate the gain of the added current amplifier in the oscillator circuits 25 or 60 of FIG. 5:

$$f=fo+(Ko)(gm)(v1-v2)+(K)(Ko)(i) \quad \text{Expression(3)}$$

where

K=gain of the current amplifier 74 or 66 in the oscillator circuit 25 or 50 of FIG. 5.

Figure 6:
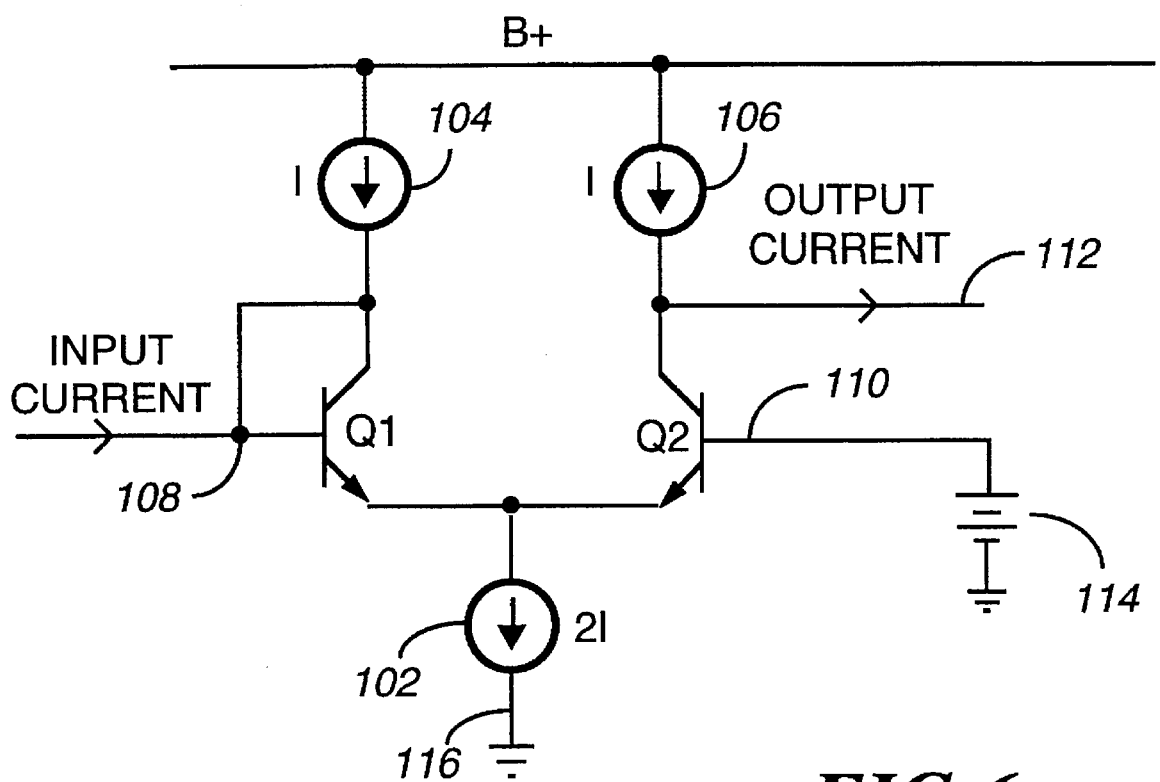
FIG. 6 is an electrical schematic diagram of a current amplifier used in the circuits of FIGS. 5 and 7.

FIG. 6 shows in greater detail one implementation of current amplifiers 66 and 74. The current amplifier in FIG. 6 is composed of two bipolar transistors Q1 and Q2, three bias current sources 102, 104 and 106, and bias voltage source 114. Transistors Q1 and Q2 are connected in a differential amplifier configuration with the emitter of transistor Q1 connected to the emitter of transistor Q2 and to the first terminal of current source 102. The second terminal of current source 102 is connected to ground 116. Transistor Q1 is diode connected with the base connected to the collector and to the second terminal of current source 104. This node 108 serves as the input terminal for the current amplifier. The first terminal of current source 104 is connected to supply voltage B+. The base of transistor Q2 serves as bias terminal 110 and is connected to the first terminal of bias voltage source 114. The collector of transistor Q2 is connected to the second terminal of current source 106. This node 112 serves as the output terminal for the current amplifier. The first terminal of current source 106 is connected to supply voltage B+. The second terminal of bias voltage source 114 is connected to ground 116. The biasing current sources 102, 104 and 106 are normally designed to track each other with the value of current sources 104 and 106 being equal to one-half the value of current source 102. Under a no input current condition, this will result in the emitter currents of transistors Q1 and Q2 being equal. Consequently, the base-emitter voltages of transistors Q1 and Q2 will be equal, if these transistors are perfectly matched, and the voltage at the input node 108 will be equal to the value of bias voltage 114. Therefore, the voltage at the input terminal 108 is controlled by setting bias voltage source 114 to the desired voltage. It should be noted that current input terminal 108 can also be used as an output terminal to provide an output voltage which is representative of the bias voltage applied to the bias terminal 110 of the amplifiers. If the current amplifier has an input current applied, the input terminal voltage is modulated with an amplitude determined by the magnitude of the input current and the value of the amplifier's input impedance. The current gain of the amplifier in FIG. 6 is equal to one.

The current amplifier features of the embodiments shown in FIGS. 4 and 5 are combinable in the same receiver circuit.

It should be understood that in the circuits shown in FIGS. 2–5, the current reference 39 optionally comprises more than two outputs (not shown), and particularly, two additional outputs are additionally coupled as a bias to the current controlled oscillator 70 and current controlled oscillator 62.

Figure 7:
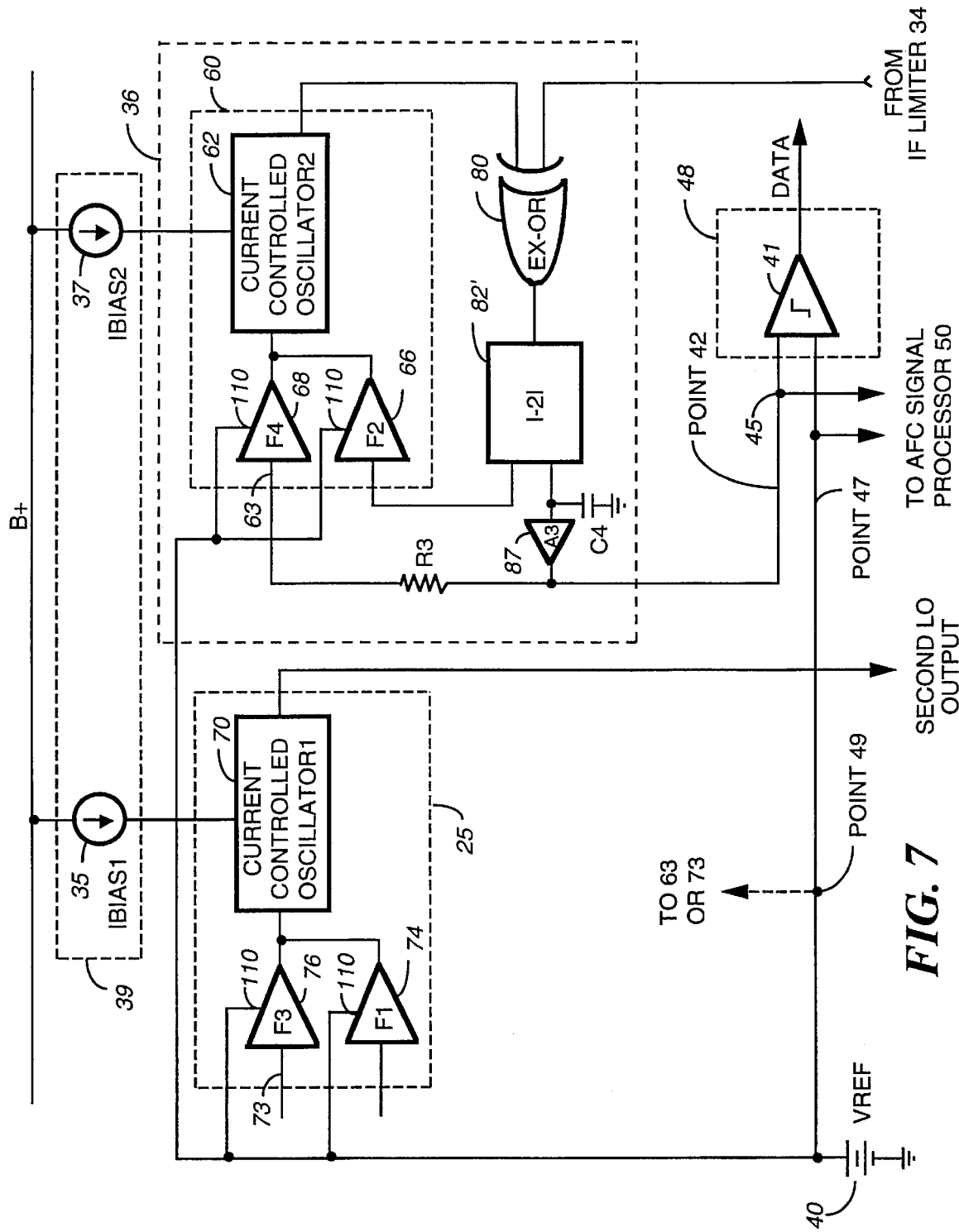
FIG. 7 is an electrical schematic diagram showing a tracking second local oscillator and phase locked loop oscillator in the demodulator according to a fifth embodiment of the present invention.

FIG. 7 illustrates yet another approach which eliminates the need to have the matched transconductance amplifiers in these circuits. In FIG. 7, the transconductance amplifier in oscillator circuit 60 in the phase locked loop demodulator 36 which in FIG. 5 was used to convert its recovered audio output voltage to a current to drive the current controlled oscillator, is replaced by resistor R3. Resistor R3 performs the same voltage-to-current conversion, but, unlike the transconductance amplifier, does not need to track any other element in the circuit. Thus, the need for a matching transconductance amplifier in second local oscillator circuit 25 is eliminated. A unity gain voltage amplifier 87 (A3) with high input impedance has been inserted between capacitor C4 and resistor R3 to provide the drive current for resistor R3 without loading the output of converter 82'. Two identical current amplifiers 76 (F3) and 68 (F4) are added to control the voltages at the input terminals 73 and 63 of oscillator circuits 25 and 60, respectively, to be substantially equal to voltage reference (VREF) 40. This is accomplished in a matter identical to that previously described in the circuit in FIG. 6 with reference to the implementation of current amplifiers 74 and 66 in FIG. 5.

Although the need for tracking transconductance amplifiers is eliminated by the circuit of FIG. 7, a new source of potential error is that the input terminal voltage of current amplifier 68 will not be exactly equal to the bias voltage applied to the bias terminal 110, which in FIG. 7 is the reference voltage (VREF) 40. This will result in an offset error of the threshold voltage for the data signal processor and AFC signal processor by the same amount. The effects of the offset error in the current amplifier 68 in FIG. 7 can be minimized or eliminated by switching the source of the data limiter threshold voltage and AFC reference voltage from reference voltage (VREF) 40 to either input 73 of current amplifier 76 or input 63 of current amplifier 68. These changes are illustrated in FIG. 7 by the dotted line connection drawn from Point 49, it being understood that the connection between Point 49 and reference voltage (VREF) 40 is eliminated with either change. When the source of the data limiter threshold voltage and AFC reference voltage is taken from input 73 of current amplifier 76, the offset voltage between the input terminal and bias terminal 110 of amplifier 68 is canceled by the same offset voltage in identical amplifier 76.

In the circuit variation of FIG. 7, where the source of the data limiter threshold voltage and AFC reference voltage is taken from input 63 of current amplifier 68, the need for tracking of the offset voltages between the input terminal and bias terminal 110 of amplifiers 68 and 76 is eliminated. However, assuming that current amplifier 68 has a non-zero, though relatively low input impedance when compared to the value of R3, the input 63 voltage does not provide a pure DC reference voltage for the data limiter 41 in data signal processor 48 and AFC error generation circuit 44 in AFC signal processor 50 (FIG. 1), and rather contains a low level modulation representative of the demodulator recovered audio signal 45. Nevertheless, since the data limiter 41 in data signal processor 48 and AFC error generation circuit 44 in AFC signal processor 50 (FIG. 1) have differential inputs, the effects of the modulation is canceled.

The input/output expression for one oscillator circuit compatible with the second local oscillator circuit 25 and the oscillator circuit 60 in FIG. 7 is given by:

$$f = fo + (K1)(Ko)(i1) + (K2)(Ko)(i2) \qquad \text{Expression (4)}$$

where f=oscillator circuit output frequency;

i1=input current to current amplifier 68 or 76 in the oscillator circuit;

i2=input current to current amplifier 66 or 74 in the oscillator circuit;

fo=oscillator circuit output frequency when i1=0 and i2=0;

Ko=gain factor for the current controlled oscillator in the oscillator circuit;

K1=gain of current amplifier 68 or 76 in the oscillator circuit; and

K2=gain of current amplifier 66 or 74 in the oscillator circuit.

In summary, the tracking second local oscillator circuit 25 and oscillator circuit 60 in phase locked loop demodulator 36 shown in FIGS. 2 through 5 and in FIG. 7 utilize the cancellation of component variations due to manufacturing make tolerance and temperature to improve the battery life of the ZIF receiver circuit 11 and make AFC more accurate. To achieve the necessary matching and tracking, the input/output expressions for the two oscillator circuits must be substantially the same over the operating range of the receiver.

Figure 8:
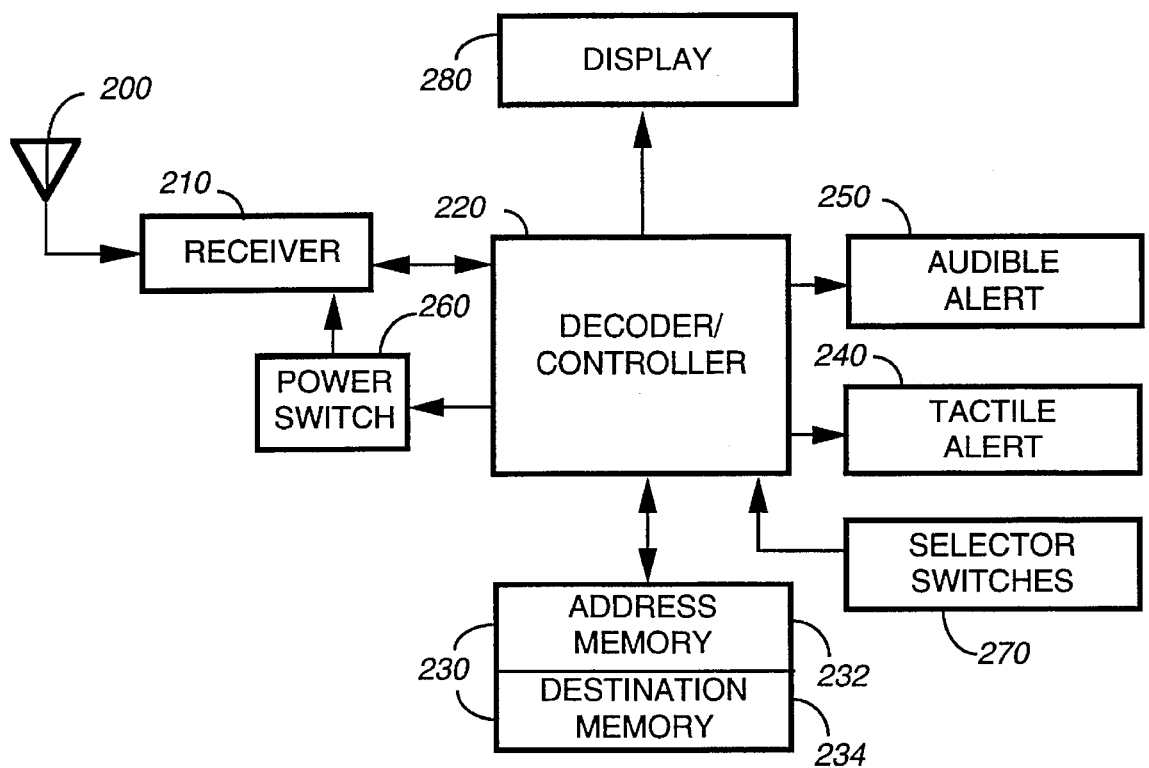
FIG. 8 is an electrical block diagram of a selective call receiver according to the present invention.

FIG. 8 shows the components of a selective call receiver 100, as an example of the type of device in which the present invention has utility. The selective call receiver 100 comprises an antenna 200, a receiver 210, a decoder/controller 227, and a code plug memory 230 including an address memory 232 and a destination memory 234. The code plug memory 230 is programmable by a remote programming device, as is well known in the art. In addition, various alert devices are provided, such as the tactile alert 240 and the audible alert 250. A power switch 260 is also provided to activate and de-activate certain components of the selective call receiver 100 under control of the decoder/controller 220. The receiver 210 comprises the receiver circuit 11 (with or without AFC) in FIG. 1 featuring one of the various embodiments of FIGS. 2–5 and FIG. 7 according to the present invention.

The decoder/controller 220 decodes information in the output signal of the receiver circuit 11 (the limited data signal) and if an address unique to the selective call receiver matches an address in the limited data signal, a message also in the information signal, or an alert, is coupled to the display.

User input into the selective call receiver is by way of selector switches 76. A menu of various user programmable features is accessed via the switches, through the use of menu information displayed on the display 280.

The above description is intended by way of example only and is not intended to limit the present invention in any way except as set forth in the following claims.

What is claimed is:

1. A zero-intermediate frequency receiver circuit for receiving a radio frequency signal detected by an antenna, the receiver circuit comprising:

an amplifier for amplifying the radio frequency signal detected by the antenna and generating an amplified signal;

a first local oscillator circuit for generating a first local oscillator signal;

a first mixer coupled to the first local oscillator circuit and to the amplifier for mixing the amplified signal with the first local oscillator signal and generating a first mixed signal;

a base band filter coupled to the first mixer for filtering the first mixed signal and generating a filtered signal;

a voltage reference for providing a voltage reference signal;

a current reference for providing first and second current reference signals which are substantially equal;

a second local oscillator circuit coupled to the voltage reference and coupled to the current reference for receiving the first current reference signal, for generating a second local oscillator signal;

a second mixer coupled to the second local oscillator circuit and to the base band filter for mixing the filtered signal and generating at an output a second mixed signal;

a phase locked loop demodulator having an oscillator circuit coupled to the current reference for receiving the second current reference signal and coupled to the output of the second mixer for generating a phase locked loop oscillator signal, the phase locked loop demodulator for demodulating the second mixed signal to generate at an output a demodulated signal;

wherein a functional relationship between inputs and output of the second local oscillator circuit is substantially equal to a functional relationship between inputs and output of the oscillator circuit of the phase locked loop demodulator; and a signal processor having at least a threshold input and a signal input, and an output, the threshold input of the signal processor coupled to the voltage reference, the signal input of the signal processor being coupled to the output of the phase locked loop demodulator, the signal processor generating at the output an output signal based on signals at the threshold input and signal input.

2. The receiver circuit of claim 1, wherein the second local oscillator circuit comprises:

a first current controlled oscillator having an input and an output;

a first transconductance amplifier having at least one input, a bias, and an output, the bias of the first transconductance amplifier coupled to the current reference, the at least one input of the first transconductance amplifier coupled to the voltage reference, and the output of the first transconductance amplifier coupled to the input of the first current controlled oscillator;

wherein the oscillator circuit of the phase locked loop demodulator comprises:

a second current controlled oscillator having an input and an output, the phase locked loop oscillator signal being generated at the output of the second current controlled oscillator; and a second transconductance amplifier having at least one input, a bias and an output, the bias of the second transconductance amplifier coupled to the current reference, the at least one input coupled to the output of the second current controlled oscillator, the output of the second transconductance amplifier coupled to the input of the second current controlled oscillator.

3. The receiver circuit of claim 2, wherein the phase locked loop demodulator comprises an exclusive-OR gate having first and second inputs and an output, and a voltage-to-current converter having an input coupled to the output of the exclusive-OR gate and at least one output coupled to the at least one input of the second transconductance amplifier, the first input of the exclusive-OR gate coupled to the output of the second current controlled oscillator and the second input of the exclusive-OR gate coupled to the output of the second mixer.

4. The receiver circuit of claim 3, wherein the voltage-to-current converter comprises first and second outputs, the first output coupled to the input of the second current controlled oscillator, and the second output coupled to the at least one input of the second transconductance amplifier, wherein a signal at the second output is proportional to a signal at the first output by a constant factor, and further comprising a capacitor connected between the second output of the voltage-to-current converter and ground.

5. The receiver circuit of claim 4, and further comprising first and second buffer amplifiers each having an input and an output, the input of the first buffer amplifier coupled to the first output of the voltage-to-current converter, the input of the second buffer amplifier coupled to the second output of the voltage-to-current converter, and the output of the second buffer amplifier coupled to the at least one input of the second transconductance amplifier.

6. The receiver circuit of claim 5, wherein the first and second buffer amplifiers are matched such that a ratio of currents in their respective inputs is equal to a ratio of currents in the first and second outputs of the voltage-to-current converter.

7. The receiver circuit of claim 4, and further comprising first and second current amplifiers each having an input, an output, and a bias, the bias of the first current amplifier coupled to the voltage reference and the output coupled to the input of the first current controlled oscillator, the input of the second current amplifier coupled to the first output of the voltage-to-current converter, the output of the second current amplifier coupled to the input of the second current controlled oscillator and the bias of the second current amplifier coupled to the voltage reference.

8. The receiver circuit of claim 3, wherein the phase locked loop demodulator further comprises a loop filter comprising a resistor and capacitor connected in series and coupled to the output of the voltage-to-current converter, and wherein a voltage across the capacitor corresponds to a recovered audio voltage signal.

9. The receiver circuit of claim 1, wherein the second local oscillator circuit comprises:

a first current controlled oscillator having an input and an output;

a first current amplifier having an input, an output and a bias, the output of the first current amplifier coupled to the input of the first current controlled oscillator, the bias of the first current amplifier being coupled to the voltage reference;

wherein the phase locked loop demodulator comprises:

a second current controlled oscillator having an input and an output, the phase locked loop oscillator signal being generated at the output of the second current controlled oscillator;

a second current amplifier having an input, an output and a bias, the output of the second current amplifier coupled to the input of the second current controlled oscillator, the bias of the second current amplifier being coupled to the voltage reference;

an exclusive-OR gate having first and second inputs and an output, the first input coupled to the output of the second current controlled oscillator, the second input coupled to the second mixer;

a voltage-to-current converter having an input and first and second outputs, the input coupled to the output of the exclusive-OR gate, the first output coupled to the input of the second current controlled oscillator, a signal at the first output being proportional to a signal at the second output by a constant factor;

a capacitor connected between the second output of the voltage-to-current converter and ground; and a resistor coupled between the capacitor and the input of the second current amplifier.

10. The receiver circuit of claim 9, wherein the second local oscillator circuit comprises a third current amplifier having an input, output and bias, the bias coupled to the voltage reference, the output coupled to the input of the first current controlled oscillator; and wherein the oscillator circuit of the phase locked loop demodulator comprises a fourth current amplifier having an input, an output and a bias, the bias coupled to the voltage reference, the input connected to the first output of the voltage-to-current converter and the output connected to the input of the second current controlled oscillator.

11. The receiver circuit of claim 9, wherein the threshold input of the signal processor is coupled to the input of the first current amplifier.

12. The receiver circuit of claim 9, wherein the threshold input of the signal processor is coupled to the input of the second current amplifier.

13. The receiver circuit of claim 9, wherein the signal processor is a data limiter, wherein the output signal of the signal processor is a data signal generated by comparing the demodulated signal with a signal at the threshold input thereof.

14. The receiver circuit of claim 9, wherein the signal processor comprises an automatic frequency control (AFC) signal processor having a first input coupled to the voltage reference and a second input coupled to the output of the phase locked loop demodulator for generating as output an AFC error signal which is coupled to the first local oscillator circuit.

15. The receiver circuit of claim 14, and further comprising:

a tunable capacitor coupled to the first local oscillator circuit and to the AFC signal processor for changing a frequency of the first local oscillator signal in response to the AFC error signal.

16. The receiver circuit of claim 1, wherein the signal processor is a data limiter, wherein the output signal of the signal processor is a data signal generated by comparing the demodulated signal with a signal at the threshold input of the signal processor.

17. The receiver circuit of claim 1, wherein the signal processor comprises an automatic frequency control (AFC) signal processor having a first input coupled to the voltage reference and a second input coupled to the output of the phase locked loop demodulator for generating as output an AFC error signal which is coupled to the first local oscillator circuit.

18. The receiver circuit of claim 17, and further comprising:

a tunable capacitor coupled to the first local oscillator circuit and to the AFC signal processor for changing a frequency of the first local oscillator signal in response to the AFC error signal.

19. A selective call receiver comprising the receiver circuit of claim 1, and further comprising:

a decoder coupled to the output of the signal processor of the receiver circuit for decoding information in the output signal of the signal processor;

a memory coupled to the decoder for storing an address unique to a particular selective call receiver; and a display coupled to the decoder for displaying a message in the information received by the receiver circuit.

20. A zero-intermediate frequency receiver circuit for receiving a radio frequency signal detected by an antenna, the receiver circuit comprising:

an amplifier for amplifying the radio frequency signal detected by the antenna and generating an amplified signal;

a first local oscillator circuit for generating a first local oscillator signal;

a first mixer coupled to the first local oscillator circuit and to the amplifier for mixing the amplified signal with the first local oscillator signal and generating a first mixed signal;

a base band filter coupled to the first mixer for filtering the first mixed signal and generating a filtered signal;

a voltage reference for providing a voltage reference signal;

a current reference for providing first and second current reference signals which are substantially equal;

a second local oscillator circuit coupled to the voltage reference and coupled to the current reference for receiving as input the first current reference signal, for generating as output a second local oscillator signal in accordance with an input to output functional relationship;

a second mixer coupled to the second local oscillator circuit and to the base band filter for mixing the filtered signal and generating at an output a second mixed signal;

a phase locked loop demodulator having an oscillator circuit coupled to the current reference for receiving the second current reference signal and coupled to the output of the second mixer for generating a phase locked loop oscillator signal in accordance with an input to output functional relationship, the phase locked loop demodulator for demodulating the second mixed signal to generate at an output a demodulated signal;

wherein the input to output functional relationship of the second local oscillator circuit is substantially the same as the input to output functional relationship of the oscillator circuit of the phase locked loop demodulator; and a signal processor having at least a threshold input and a signal input, and an output, the threshold input of the signal processor coupled to the voltage reference, the signal input of the signal processor being coupled to the output of the phase locked loop demodulator, the signal processor generating at the output an output signal based on signals at the threshold input and signal input.

\* \* \* \* \*